United States Patent
Fujisawa

(10) Patent No.: US 7,313,051 B2
(45) Date of Patent: Dec. 25, 2007

(54) OUTPUT CONTROL SIGNAL GENERATING CIRCUIT

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/523,705

(22) Filed: Sep. 20, 2006

(65) Prior Publication Data

US 2007/0064517 A1    Mar. 22, 2007

(30) Foreign Application Priority Data

Sep. 20, 2005    (JP)    ............................. 2005-272976

(51) Int. Cl.
*G11C 8/00*    (2006.01)
(52) U.S. Cl. ................. 365/233; 365/189.05; 327/270; 327/271
(58) Field of Classification Search ................ 365/233, 365/194, 189.05, 189.12, 230.08; 327/153, 327/270–271
See application file for complete search history.

(56) References Cited

U.S. PATENT DOCUMENTS 6,222,792 B1 *  4/2001  Hanzawa et al. ........... 365/233
6,862,250 B2 *  3/2005  Shin .......................... 365/233
6,920,080 B2 *  7/2005  Chung et al. ............... 365/233
2006/0250882 A1 * 11/2006 Choi et al. .................. 365/233

FOREIGN PATENT DOCUMENTS

JP    2003-281888    10/2003

\* cited by examiner

*Primary Examiner*—Anh Phung
*Assistant Examiner*—Hien Nguyen
(74) *Attorney, Agent, or Firm*—McDermott Will & Emery LLP

(57) ABSTRACT

An output control signal generating circuit includes latch circuits that are connected in cascade, and a timing signal generating circuit that generates a timing signal to be supplied to the latch circuits, based on a second clock of which phase is advanced from the phase of a first clock used to take in a read command. The timing signal generating circuit delays the phase of a timing signal to be supplied to a relatively pre-stage latch circuit included in the latch circuits, from the phase of a timing signal to be supplied to a relatively latter stage latch circuit included in the latch circuits. With this arrangement, a latch margin of a first latch circuit does not depend on the cycle of an external clock. Accordingly, even when a clock has a very high speed, the output can be controlled correctly.

7 Claims, 4 Drawing Sheets

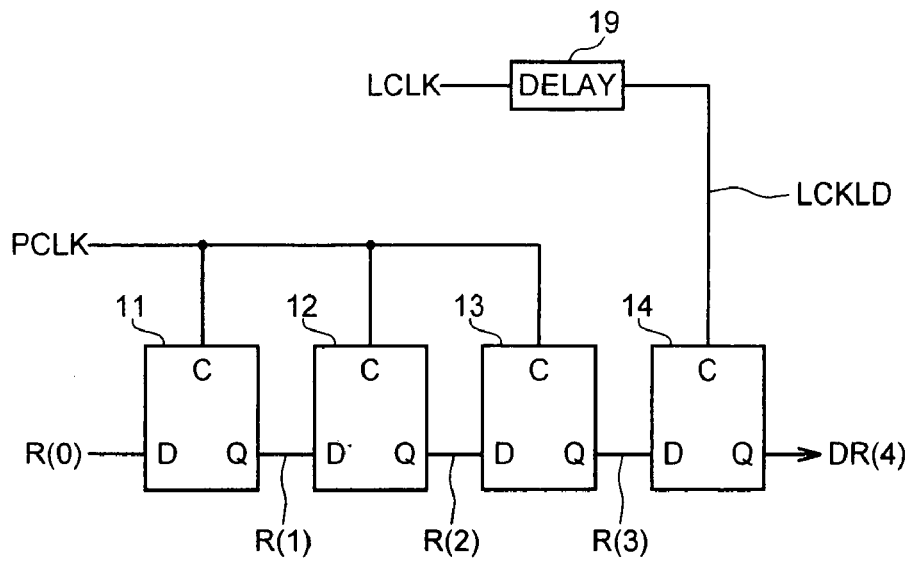
FIG.3 -- *PRIOR ART*
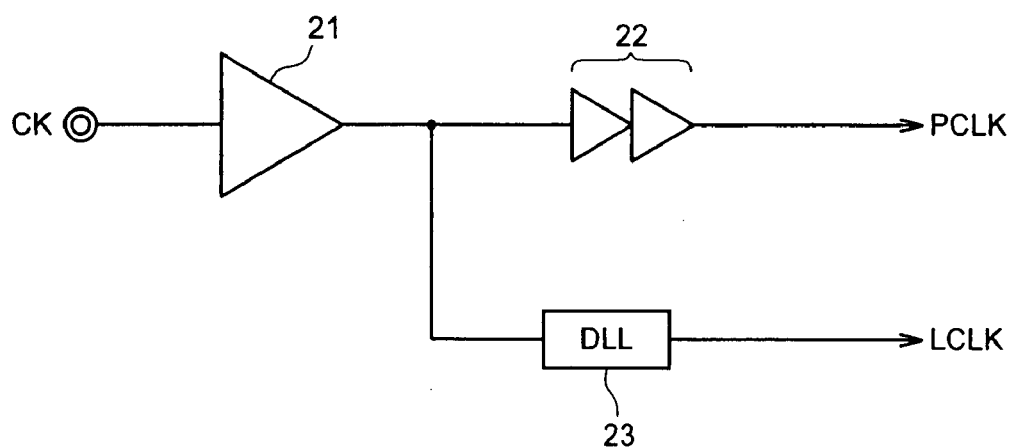
FIG.4 -- *PRIOR ART*

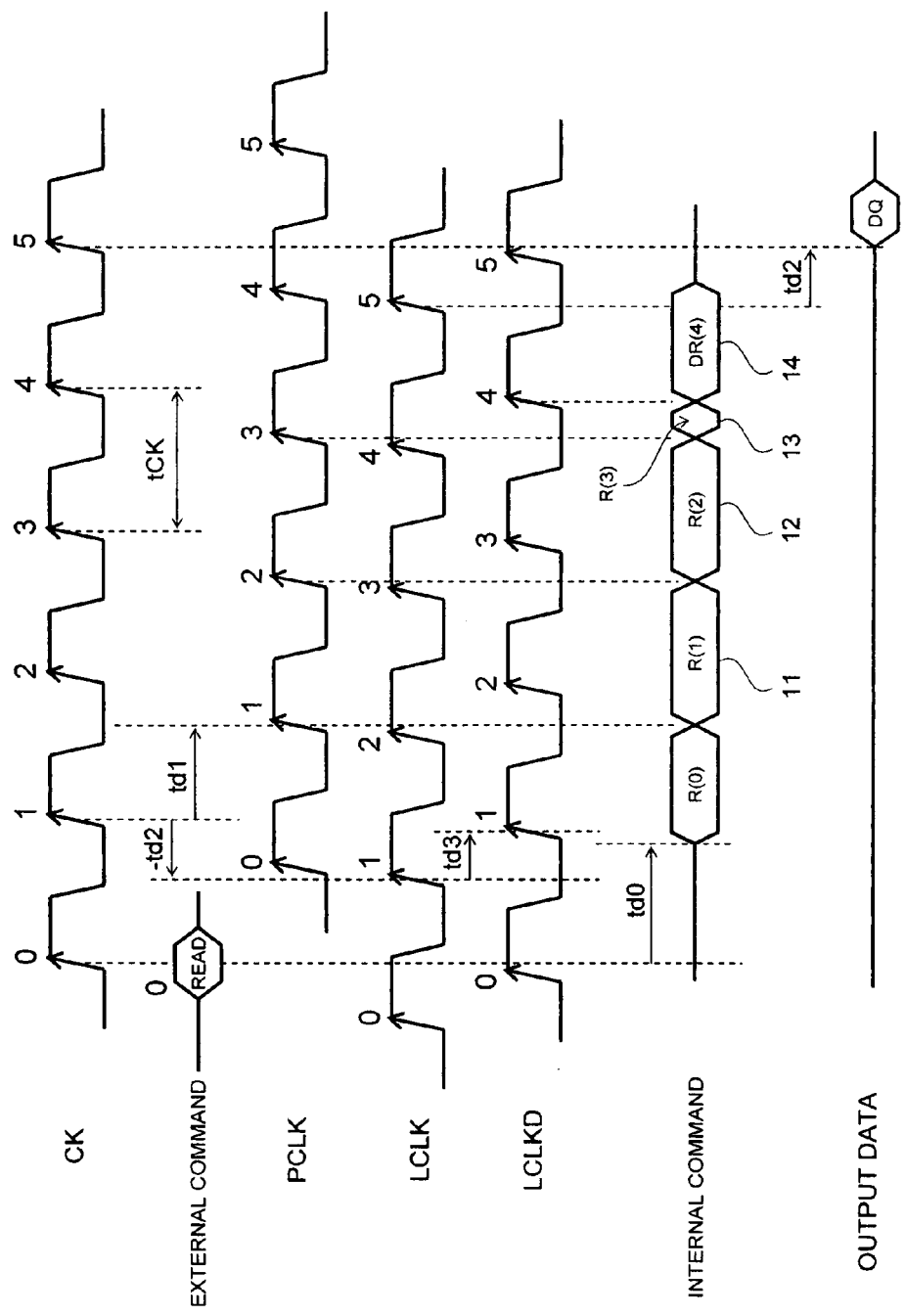
FIG.5 -- PRIOR ART

OUTPUT CONTROL SIGNAL GENERATING CIRCUIT

TECHNICAL FIELD

The present invention relates to an output control signal generating circuit, and more particularly relates to an output control signal generating circuit suitable for application to a synchronous semiconductor storage device.

BACKGROUND OF THE INVENTION

A synchronous semiconductor storage device as represented by a synchronous DRAM (Synchronous Dynamic Random Access Memory) is widely used for a main memory and the like of a personal computer. Because the synchronous semiconductor storage device can input and output data in synchronism with a clock signal supplied from a controller, a data transfer rate of the data can be increased by using a higher-speed clock.

However, so long as a DRAM core performs an analog operation in the synchronous DRAM, a considerably weak charge needs to be amplified based on a sense operation. Therefore, the semiconductor storage device cannot shorten the time from when a first read command is issued until when first data is output. The semiconductor device can output the first data in synchronism with an external clock after a lapse of a predetermined delay time since the issuance of the read command. This delay time is generally called "CAS latency" and is set to an integer times a clock cycle. For example, when the CAS latency is 5 (CL=5), the semiconductor storage device outputs the first data in synchronism with the external clock after five cycles since the device reads the read command synchronously with the external clock. In other words, the semiconductor device outputs the first data after a lapse of the five clocks.

However, a peripheral circuit part of the synchronous DRAM performs an operation in synchronism with various kinds of internal clocks different from the external clock. Therefore, in order to correctly output the first data in synchronism with the external clock after taking in the read command, the semiconductor storage device needs to use an "output control signal generating circuit" that synchronizes an internal command synchronous with the internal clock with the external clock.

FIG. 3 is a circuit diagram of a conventional output control signal generating circuit.

The output control signal generating circuit shown in FIG. 3 is the one that sets the CAS latency to 5 (CL=5) and includes four (the number of CL−1) latch circuits 11 to 14 that are connected in cascade. Each of these latch circuits 11 to 14 is what is called a D latch circuit that includes an input terminal D, an output terminal Q, and a clock terminal C. Each D latch circuit takes in a signal supplied to the input terminal D, in response to a change of a signal supplied to the clock terminal C from a low level to a high level, and outputs the signal supplied to the input terminal D, from the output terminal Q.

An internal clock PCLK is supplied in common to the clock terminal C of each of the first to the third latch circuits 11 to 13 out of the four latch circuits 11 to 14. On the other hand, an internal clock LCLKD that is an internal clock LCLK delayed by a delay circuit 19 is supplied to the clock terminal C of the last latch circuit 14. An internal command R(0) is supplied to the input terminal D of the first latch circuit 11, and this internal command R(0) is sequentially shifted to the latch circuits 12 to 14. The (0) attached to the end of the internal command R means an internal command that is linked to an active edge #0 of an external clock CK. Therefore, internal commands R that are linked to active edges #1 to #3 of the external clock CK are expressed as internal commands R(1) to R(3) respectively.

The last latch circuit 14 takes in the internal command R(3) and outputs this internal command as an output control signal DR(4) as one kind of the internal command. Therefore, the output control signal DR(4) is synchronism with an active edge #4 of the external clock CK.

FIG. 4 is a schematic diagram of a circuit that generates the internal clocks PCLK and LCLK.

As shown in FIG. 4, the internal clocks PCLK and LCLK are generated based on the external clock CK. In other words, an input buffer 21 buffers the external clock CK and supplies the buffered external clock CK to an internal buffer 22 and a DLL (Delay Locked Loop) circuit 23, respectively. The clock that passes the internal buffer 22 becomes the internal clock PCLK, and the clock that is generated by the DLL circuit 23 becomes the internal clock LCLK. Consequently, the internal clock PCLK is delayed by the input buffer 21 and the internal buffer 22, and becomes a signal of which phase is delayed from the phase of the external clock CK. On the other hand, the internal clock LCLK becomes a signal of which phase is advanced from that of the external clock CK, due to the function of the DLL circuit 23.

The operation of the output control signal generating circuit shown in FIG. 3 is explained next.

FIG. 5 is a timing diagram indicating the operation of the output control signal generating circuit shown in FIG. 3.

As shown in FIG. 5, when a read command READ as one kind of the external command is issued in synchronously with the active edge #0 of the external clock CK, the internal command R(0) is generated based on this taking in of the read command READ. A predetermined delay time td0 is necessary before the internal command R(0) is generated after the read command READ is issued. Therefore, the internal command R(0) is generated after the delay time td0, from the active edge #0 of the external clock CK. As explained above, the internal command R(0) is generated at the timing linked to the active edge #0 of the external clock CK.

The internal command R(0) generated in this way is supplied to the latch circuit 11 within the output control signal generating circuit, as shown in FIG. 3. As described above, the internal clock PCLK is supplied in common to the clock terminal C of each of the latch circuits 11 to 13. Consequently, the latch circuit 11 takes in the internal command R(0) in synchronism with the internal clock PCLK. Thereafter, the internal command R(0) is shifted sequentially.

More specifically, the latch circuit 11 latches the internal command R(0) in synchronism with the active edge #1 of the internal clock PCLK and generates the internal command R(1). In this case the active edge #1 of the internal clock PCLK is the edge corresponding to the active edge #1 of the external clock CK. Similarly, the latch circuit 12 latches the internal command R(1) in synchronism with the active edge #2 of the internal clock PCLK and generates the internal command R(2). Further, the latch circuit 13 latches the internal command R(2) in synchronism with the active edge #3 of the internal clock PCLK and generates the internal command R(3).

As shown in FIG. 5, the internal clock PCLK is a signal of which phase is delayed from that of the external clock CK by td1. Therefore, a latch margin M1 for the latch circuit 11 to take in the internal command R(0) is expressed as $$M1 = tCK - td0 + td1 \qquad (1),$$

where tCK represents the cycle of the external clock CK. On the other hand, latch margins M2 and M3 of the latch circuits 12 and 13 are equal to tCK, respectively.

At the time of generating the output control signal DR(4) from the internal command R(3), clocks are changed. In other words, the latch circuit 13 that generates the internal command R(3) operates synchronously with the internal clock PCLK. On the other hand, the latch circuit 14 that generates the output control signal DR(4) operates synchronously with the internal clock LCLKD. Therefore, a latch margin M4 for the latch circuit 14 to take in the internal command R(3) is different from the latch margins M2 and M3.

In other words, as shown in FIG. 5, the phase of the internal clock LCLK is advanced from that of the external clock CK by td2 (the phase is delayed by −td2), and the phase of the internal clock LCLKD is delayed from that of the internal clock LCLK by td3. Therefore, a latch margin M4 (a change margin) for the latch circuit 14 to take in the internal command R3 is expressed as $$M4 = tCK - td1 - td2 + td3 \qquad (2).$$

The output control signal DR(4) that is output from the latch circuit 14 is supplied to an output buffer not shown. The output buffer starts the output operation of the data in synchronism with an active edge #5 of the internal clock LCLK. In this case, the output buffer has an operation delay that is the same as the delay of the above td2. As a result, the data is actually output synchronously with the active edge #5 of the external clock CK.

Based on the above operation, the output control circuit signal generating circuit shown in FIG. 3 can generate the output control signal DR(4) so that the CAS latency becomes 5 (CL=5) and supply this output control signal DR(4) to the output buffer.

However, according to the output control signal generating circuit shown in FIG. 3, while the generation timing of the internal command R(0) is linked to the active edge #0 of the external clock CK, the circuit uses the signal linked to the active edge #1 of the external clock CK (the active edge #1 of the internal clock PCLK) at the time of taking in the internal command R(0). Therefore, as is clear from the above expression (1), the latch margin M1 depends on the cycle tCK of the external clock CK. Consequently, when the frequency of the external clock CK becomes high, there is risk that the latch margin M1 becomes short and the output control becomes difficult.

Further, at the time of generating the output control signal DR(4) from the internal command R(3) clocks need to be changed. Consequently, there is also a risk that the latch margin M4 as a change margin becomes short.

In order to avoid the need for the change of clocks, it is considered suitable to use the internal clock LCLK of which phase is advanced from the phase of the external clock CK, in all the latch circuits including the first latch circuit, without using the internal clock PCLK of which phase is delayed from the phase of the external clock CK, as described in Japanese Patent Laid Open No. 2003-281888. However, according to the system described in the Japanese Patent Laid Open No. 2003-281888, a signal linked to the active edge #1 of the external clock CK (the active edge #1 of the internal clock LCLK) is also used to take in the internal command R(0). Therefore, the latch margin M1 depends on the cycle tCK of the external clock, in a similar manner to that of the output control signal generating circuit shown in FIG. 3. Consequently, when the frequency of the external clock CK becomes high, there is a risk that the output control becomes difficult.

It is clear from the circuit configuration described in the Japanese Patent Laid Open No. 2003-281888 that the latch margin M1 depends on the cycle tCK of the external clock. For example, in the Japanese Patent Laid Open No. 2003-281888, when it is assumed that the CAS latency is 5, four latch circuits connected in series are required to generate an output control signal LATENCY in response to a read master signal RM being activated. In other words, the number of latch circuits becomes smaller than the number of the CAS latency by one. The latch margin of the read master signal RM depends on a difference between PLCKDQ that is phase-controlled by a delay synchronous loop circuit and the external clock. In other words, the latch margin depends on a time component proportional to the external clock cycle tCK. When the CAS latency takes other value, it is also clear that the latch margin of the read master signal RM depends on the external clock cycle.

SUMMARY OF THE INVENTION

The present invention has been achieved to solve the above problems. It is an object of the present invention to provide an improved output control signal generating circuit that can be suitably applied to a synchronous semiconductor storage device.

It is another object of the invention to provide an output control signal generating circuit that does not require a change of clocks and in which the latch margin of the first latch circuit does not depend on the cycle of the external clock.

The above and other objects of the present invention can be accomplished by an output control signal generating circuit that takes in a read command in synchronism with a first clock and that controls an output timing of read data in synchronism with the first clock after n (where n is a natural number) cycles, the output control signal generating circuit comprising: n latch circuits connected in cascade, including a first-stage latch circuit that latches an internal command generated based on the read command and a last-stage latch circuit that outputs an output control signal; and a timing signal generating circuit that generates a timing signal to be supplied to the n latch circuits, based on a second clock of which phase is advanced from a phase of the first clock, wherein the timing signal generating circuit delays the phase of a timing signal to be supplied to a relatively pre-stage latch circuit included in the latch circuits, from the phase of another timing signal to be supplied to a relatively latter stage latch circuit included in the latch circuits.

According to the present invention, latch circuits of the number (=n) same as that of the latency are used. Further, the phase of a timing signal supplied to a pre-stage latch circuit is delayed from the phase of a timing signal supplied to a latter-stage latch circuit. Therefore, both the generation timing of an internal command and the timing at which a first latch circuit takes in the internal command can be linked to an active edge of a first clock that is used to take in a read command. As a result, a latch margin of the first latch circuit does not depend on the cycle of the external clock. Consequently, even when the first clock is very fast, the output control can be performed correctly.

Since an internal clock of which phase is delayed from the phase of the first clock does not need to be used, the change of clocks is not necessary, unlike the conventional techniques. Consequently, it is not necessary to secure a change margin.

As described above, according to the present invention, it becomes possible to provide an output control signal generating circuit that does not require a change of clocks and in which the latch margin of the first latch circuit does not depend on the cycle of the external clock. Accordingly, the frequency of the first clock can be increased. Consequently, even when the first clock is very fast, the output control can be performed correctly. Therefore, the output control signal generating circuit according to the present invention can be most suitably applied to a synchronous DRAM that uses a high-speed clock.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 3 is a circuit diagram of a conventional output control signal generating circuit;

FIG. 4 is a schematic diagram of a circuit that generates the internal clocks PCLK and LCLK; and FIG. 5 is a timing diagram indicating the operation of the output control signal generating circuit shown in FIG. 3.

DETAILED DESCRIPTION OF THE EMBODIMENTS

Preferred embodiments of the present invention will now be explained in detail with reference to the drawings.

Figure 1:
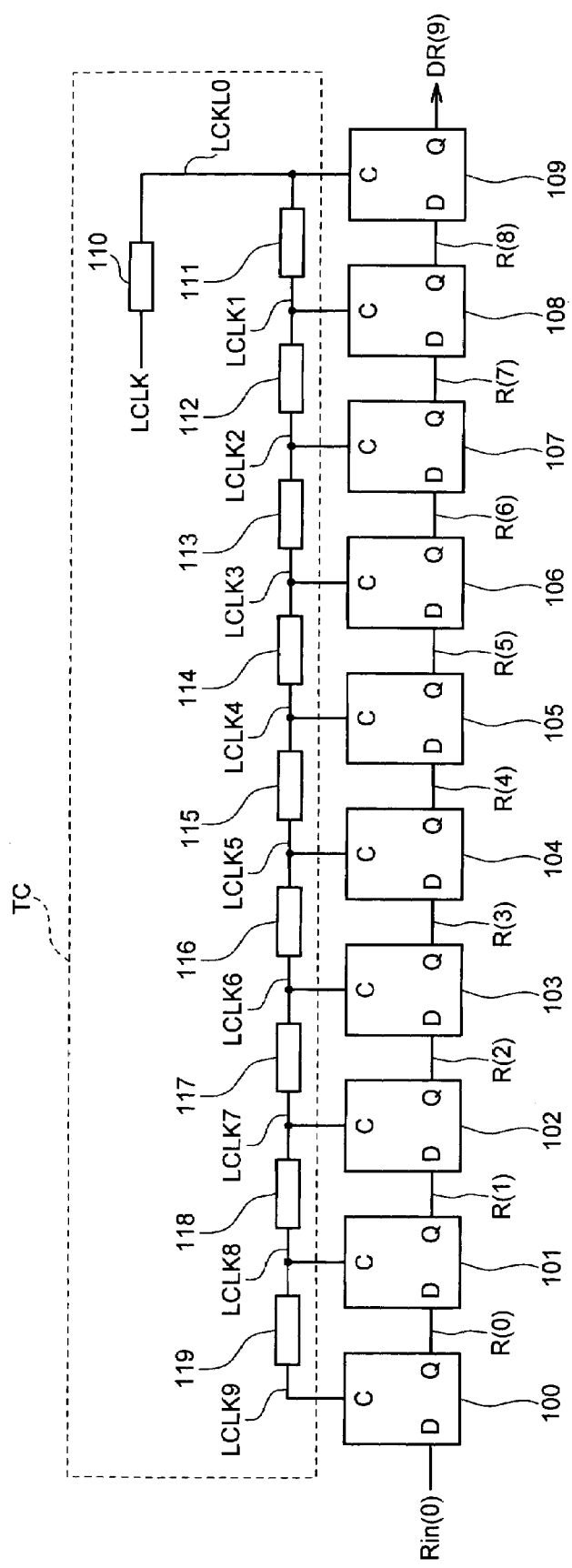
FIG. 1 is a circuit diagram of an output control signal generating circuit according to a preferred embodiment of the present invention.

FIG. 1 is a circuit diagram of an output control signal generating circuit according to a preferred embodiment of the present invention.

The output control signal generating circuit according to the present embodiment is a circuit that sets the CAS latency of a synchronous DRAM to 10 (CL=10), and includes ten (=CL) latch circuits 100 to 109 (a latch circuit group) that are connected in cascade. As already explained above, the synchronous DRAM cannot shorten the time from when a read command is issued until when first data is output. Therefore, there is a tendency that the CAS latency becomes large when the frequency of an external clock becomes high. For example, when a DRAM in which the frequency of the external clock is 400 MHz and the CAS latency is 5 is attempted to be operated using an external clock of 800 MHz, the CAS latency becomes 10.

Each of these latch circuits 100 to 109 is what is called a D latch circuit having an input terminal D, an output terminal Q, and a clock terminal C. Each D latch circuit takes in a signal supplied to the input terminal D, in response to a change of a signal supplied to the clock terminal C from a low level to a high level, and outputs the signal supplied to the input terminal D, from the output terminal Q.

Further, the output control signal generating circuit according to the present embodiment has a timing signal generating circuit TC that includes ten delay circuits 110 to 119 connected in cascade. Timing signals LCLK0 to LCLK9 that are output from the delay circuits 110 to 119 are supplied to the clock terminals C of the latch circuits 109 to 100, respectively. A clock generated by the DLL circuit is supplied as an internal clock LCLK to the first delay circuit 110. Therefore, when CL=n (10 in the present embodiment), the timing signal generating circuit TC supplies a timing signal delayed by (n−k+1) delay elements, to a k-th (where k is a natural number equal to or smaller than n) latch circuit counted from the first latch circuit 100. Preferably, delays of the timing signal performed by the delay circuits 110 to 119 are substantially equal to each other, although the delays are not particularly limited.

As explained with reference to FIG. 4, the internal clock LCLK is a signal generated by the DLL circuit, and the phase of this signal is advanced from the phase of the external clock CK. Unlike conventional output control signal generating circuits, the output control signal generating circuit according to the present embodiment does not use the internal clock PCLK of which phase is delayed from the phase of the external clock CK.

As shown in FIG. 1, an internal command Rin(0) is supplied to the input terminal D of the first latch circuit 100, and this internal command Rin(0) is sequentially shifted to the latch circuits 101 to 109. Specifically, the k-th (where k is a natural number equal to or smaller than n) latch circuit counted from the first latch circuit 100 operates in synchronism with a timing signal generated based on the k-th active edge from the viewpoint of the active edge #0 of the external clock CK. As already explained above, the numeral (0) attached to the end of the internal command R (or Rin) means the internal command linked to the active edge #0 of the external clock CK. Therefore, the internal commands linked to the active edges #1 to #8 of the external clock CK are expressed as internal commands R(1) to R(8), respectively.

In this case, the internal command supplied to the first latch circuit 100 is expressed as Rin(0), and the internal command supplied to the next latch circuit 101 is expressed as R(0). This means that these internal commands are signals linked to the active edge #0 of the external clock CK.

The operation of the output control signal generating circuit according to the present embodiment is explained next.

Figure 2:
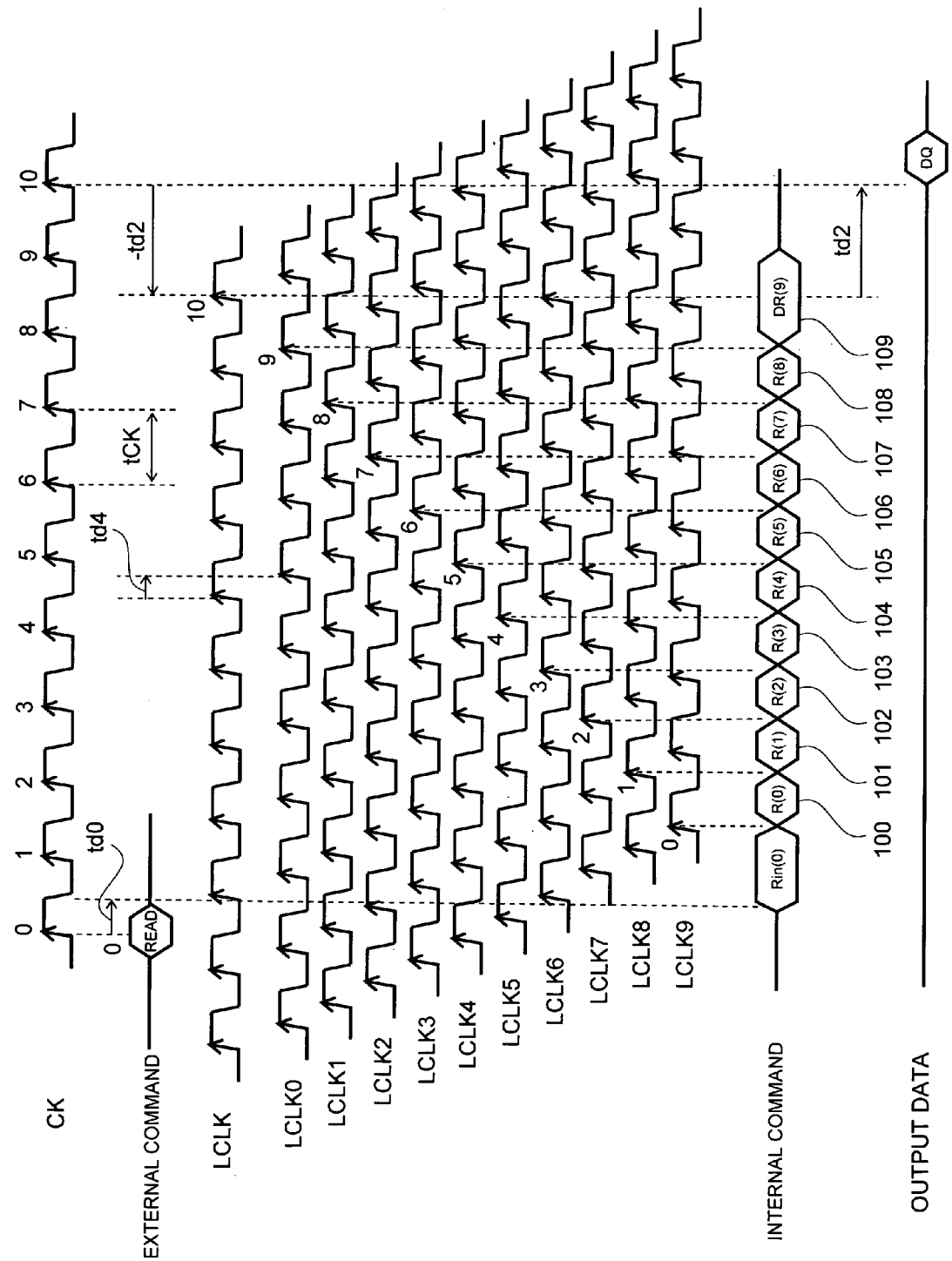
FIG. 2 is a timing diagram showing the operation of the output control signal generating circuit shown in FIG. 1.

FIG. 2 is a timing diagram showing the operation of the output control signal generating circuit according to the present embodiment.

As shown in FIG. 2, when the read command READ as one kind of the external command is taken in synchronously with the active edge #0 of the external clock CK, the internal command Rin(0) is generated based on this taking in of the read command READ. As already explained above, the predetermined delay time td0 is necessary before the internal command Rin(0) is generated after the read command READ is taken in. Therefore, the internal command Rin(0) is generated after the delay time td0, from the active edge #0 of the external clock CK. As explained above, the internal command Rin(0) is generated at the timing linked to the active edge #0 of the external clock CK.

The internal command Rin(0) generated in this way is supplied to the latch circuit 100 within the output control signal generating circuit, as shown in FIG. 1.

On the other hand, the internal clock LCLK of which phase is advanced from the phase of the external clock CK by td2 (of which phase is delayed from the phase of the external clock CK by −td2) is supplied to the timing signal generating circuit TC. The delay circuits 110 to 119 included in the timing signal generating circuit TC generate the timing signals LCLK0 to LCLK9 of which phases are delayed sequentially. As shown in FIG. 1, the timing signals LCLK0 to LCLK9 are supplied to the clock terminals C of the latch circuits 109 to 100, respectively.

When the delay of each of the delay circuits 110 to 119 is td4, for example, the timing signal LCLK9 supplied to the first latch circuit 100 becomes a signal of which phase is delayed from the phase of the internal clock LCLK by 10×td4. Therefore, in order to correctly latch the internal command Rin(0) using the timing signal LCLK9, the condition of $$td0<10 \times td4-td2 \quad (3)$$

needs to be satisfied.

In other words, the latch margin M0 for the latch circuit 100 to latch the internal command R0 is expressed by $$M0=10 \times td4-td2-td0 \quad (4).$$

On the other hand, the latch circuits 101 to 109 latch the internal commands R(0) to R(8) in synchronism with the timing signals LCLK1 to LCLK9, respectively. In this case, the timing signal generating circuit TC delays the phase of the timing signal to be supplied to a latch circuit one stage before a predetermined latch circuit, by a delay of td4 from the phase of the timing signal supplied to the predetermined latch circuit. In other words, the timing signal generating circuit TC advances the phase of the timing signal to be supplied to a latch circuit one stage after the predetermined latch circuit, by the delay of td4 from the phase of the timing signal supplied to the predetermined latch circuit. Therefore, when the cycle of the external clock CK is tCK, the delay td4 needs to be set to $$tCK>td4 \quad (5).$$

In other words, the latch margins M1 to M9 for the latch circuits 101 to 109 to latch the internal commands R(0) to R(8) are expressed as $$M1 \text{ to } M9=tCK-td4 \quad (6).$$

As explained above, the latch circuits 100 to 109 continuously perform the latch operation synchronous with the active edges #0 to #9 of the timing signals LCLK9 to LCLK0, respectively. The output control signal DR(9) that is finally output from the latch circuit 109 is supplied to an output buffer not shown. The output buffer starts the output operation of data synchronously with the active edge #10 of the internal clock LCLK. The output buffer has the same operation delay as that of the above td2. As a result, the data is actually output synchronously with the active edge #10 of the external clock CK.

Based on the above operation, the output control signal generating circuit according to the present embodiment can generate the output control signal DR(9) so that the CAS latency becomes 10 (CL=10), and supply this output control signal DR(9) to the output buffer.

In the output control signal generating circuit according to the present embodiment, the generation timing of the internal command Rin(0) and the timing at which the first latch circuit 100 takes in the internal command Rin(0) are linked to the active edge #0 of the external clock CK. Therefore, as is clear from the above expression (4), the latch margin M0 for the latch circuit 100 to latch the internal command Rin(0) does not depend on the cycle tCK of the external clock CK. As a result, the frequency of the external clock CK can be set higher (tCK can be shortened), within a range in which the latch margins M1 to M9 are secured. Consequently, even when the external clock to be used has a very high speed, the output control can be performed correctly.

The output control signal generating circuit according to the present embodiment does not use the internal clock PCLK of which phase is delayed from the phase of the external clock CK. Therefore, a change margin does not need to be secured, unlike the conventional techniques.

The output control signal generating circuit according to the present embodiment performs the shift operation of the internal command R using the timing signals of which phases are advanced sequentially. Therefore, this operation is equivalent to the shift operation using a clock slightly faster than the external clock CK. As a result, it does not occur that a latch margin of only a specific latch circuit is short extremely. Consequently, the latch margins of the latch circuits 100 to 109 can be set more uniformly.

As explained above, the output control signal generating circuit according to the present embodiment can perform the correct control, even when the output control signal generating circuit is applied to a synchronous DRAM that uses a high-speed external clock.

The present invention is in no way limited to the aforementioned embodiments, but rather various modifications are possible within the scope of the invention as recited in the claims, and naturally these modifications are included within the scope of the invention.

While the output control signal generating circuit for a synchronous DRAM is explained as an example in the above embodiment, the application range of the present invention is not limited to the above. The output control signal generating circuit according to the present invention can be also applied to the control of other circuits such as the control of a cache memory mounted on a CPU.

What is claimed is:

1. An output control signal generating circuit that takes in a read command in synchronism with a first clock and that controls an output timing of read data in synchronism with the first clock after n (where n is a natural number) cycles, the output control signal generating circuit comprising:
   n latch circuits connected in cascade, including a first-stage latch circuit that latches an internal command generated based on the read command and a last-stage latch circuit that outputs an output control signal; and
   a timing signal generating circuit that generates a timing signal to be supplied to the n latch circuits, based on a second clock of which phase is advanced from a phase of the first clock, wherein
   the timing signal generating circuit delays the phase of a timing signal to be supplied to a relatively pre-stage latch circuit included in the latch circuits, from the phase of a timing signal to be supplied to a relatively latter stage latch circuit included in the latch circuits.

2. The output control signal generating circuit as claimed in claim 1, wherein the first-stage latch circuit latches the internal command in synchronism with a timing signal corresponding to an active edge of the first clock used to take in the read command.

3. The output control signal generating circuit as claimed in claim 2, wherein a k-th (where k is a natural number equal to or smaller than n) latch circuit counted from the first-stage latch circuit operates in synchronism with a timing signal generated based on a k-th active edge, from the viewpoint of the active edge of the first clock used to take in the read command.

4. The output control signal generating circuit as claimed in claim 1, wherein the first clock is an external clock, and the second clock is an internal clock.

5. The output control signal generating circuit as claimed in claim 1, wherein the timing signal generating circuit includes n delay circuits that are connected in cascade.

6. The output control signal generating circuit as claimed in claim 5, wherein the timing signal generating circuit supplies a timing signal delayed by (n−k+1) delay elements, to a k-th (where k is a natural number equal to or smaller than n) latch circuit counted from the first latch circuit.

7. The output control signal generating circuit as claimed in claim 5, wherein delays of the timing signal performed by the n delay circuits are substantially equal to each other.

* * * * *